United States Patent
Tseng et al.

(10) Patent No.: US 10,452,160 B2
(45) Date of Patent: Oct. 22, 2019

(54) MOUSE DEVICE

(71) Applicant: Cheng Uei Precision Industry Co., Ltd., New Taipei (TW)

(72) Inventors: Chi-Ming Tseng, New Taipei (TW); Chin-Chung Lin, New Taipei (TW)

(73) Assignee: CHENG UEI PRECISION INDUSTRY CO. LTD., New Taipei (TW)

( * ) Notice: Subject to any disclaimer, the term of this patent is extended or adjusted under 35 U.S.C. 154(b) by 81 days.

(21) Appl. No.: 15/729,559

(22) Filed: Oct. 10, 2017

(65) Prior Publication Data

US 2019/0107900 A1    Apr. 11, 2019

(51) Int. Cl.
*G06F 3/0354* (2013.01)
*G06F 3/038* (2013.01)
*H03K 17/97* (2006.01)

(52) U.S. Cl.
CPC .......... *G06F 3/03543* (2013.01); *G06F 3/038* (2013.01); *H03K 17/97* (2013.01); *G06F 2203/0333* (2013.01)

(58) Field of Classification Search
CPC ........ G06F 3/03543; G06F 3/038; G06F 3/01; H01H 36/00
USPC ......................................................... 345/163
See application file for complete search history.

(56) References Cited

U.S. PATENT DOCUMENTS

| 2010/0090952 A1* | 4/2010 | Zhang ................. G06F 3/03543 345/163 |
| 2012/0098748 A1* | 4/2012 | Lin ..................... G06F 3/03543 345/163 |

\* cited by examiner

*Primary Examiner* — Sardis F Azongha
(74) *Attorney, Agent, or Firm* — Cheng-Ju Chiang

(57) ABSTRACT

A mouse device includes at least one electronic switch and at least one button module. The at least one electronic switch includes a switch assembly, and a lower magnet mounted to the switch assembly. The at least one electronic switch is disposed under the at least one button module. A bottom surface of the at least one button module is equipped with an upper magnet disposed over a top of the lower magnet. Magnetic poles of the top of the lower magnet and a bottom of the upper magnet are the same. When the at least one button module is pressed downward, the lower magnet drives the switch assembly to convert a switch-off state into a switch-on state by virtue of a repelling force of the upper magnet pushing against the lower magnet, so that the at least one electronic switch is triggered.

19 Claims, 11 Drawing Sheets

MOUSE DEVICE

BACKGROUND OF THE INVENTION

1. Field of the Invention

The present invention generally relates to a mouse device, and more particularly to a mouse device capable of keeping a better hand feeling after the mouse device is used for a long time.

2. The Related Art

Referring to FIG. 9 to FIG. 11, a conventional mouse device 100' includes a circuit board 10', two electronic switches 20' and two button modules 30'. The two electronic switches 20' are fastened to a front of a top surface of the circuit board 10' and arranged transversely. Each of the two electronic switches 20' includes a switch assembly 21', an outer cover 22' and a contacting portion 23'. The outer cover 22' is covered to an outside of the switch assembly 21'. A top of the outer cover 22' opens an assembling hole 221'. The contacting portion 23' is assembled in the assembling hole 221'. A top end of the contacting portion 23' projects beyond a top surface of the outer cover 22'. A bottom end of the contacting portion 23' abuts against the switch assembly 21'. The switch assembly 21' has a switch-off state and a switch-on state. A gap 24' is formed between a surface of the contacting portion 23' and a wall of the assembling hole 221'. The two electronic switches 20' are disposed under the two button modules 30'. Bottom surfaces of the two button modules 30' protrude downward to form two pressing portions 31' corresponding to the two contacting portions 23' of the two electronic switches 20', respectively. The two pressing portions 31' are capable of abutting against top ends of the two contacting portions 23'. In use, the two button modules 30' are pressed, the two pressing portions 31' push against the two contacting portions 23' to make the switch assembly 21' converted from the switch-off state to the switch-on state, so that the two electronic switches 20' are triggered. After the two button modules 30' are completed being operated, the two button modules 30' are released and restored, the switch assembly 21' is converted from the switch-on state to the switch-off state and pushes against the two contacting portions 23' to be restored.

However, after the conventional mouse device 100' is used for a long time, contact points of the two pressing portions 31' of the two button modules 30' contacting the two contacting portions 23' of the two electronic switches 20' will be abraded to occur partial abrasion phenomena, when the user uses the conventional mouse device 100', a vacant path will be formed between an abrasion position of each of the two pressing portions 31' and one of the two contacting portions 23' of the two electronic switches 20', and external dust particles will get stuck in the gap 24' between the surface of the contacting portion 23' and the wall of the assembling hole 221' that causes an abnormal action of the contacting portion 23' of each of the two electronic switches 20'. As a result, the two button modules 30' of the conventional mouse device 100' are incapable of keeping a better hand feeling and even out of order after the conventional mouse device 100' is used for a long time in use.

Thus, in order to solve the problems described above, an innovative mouse device need be provided, after the innovative mouse device is used for a long time, the innovative mouse device will be still used in order and capable of keeping a better hand feeling in use.

SUMMARY OF THE INVENTION

An object of the present invention is to provide a mouse device capable of keeping a better hand feeling after the mouse device is used for a long time. The mouse device includes at least one electronic switch and at least one button module. The at least one electronic switch includes a switch assembly having a switch-off state and a switch-on state, and a lower magnet mounted to the switch assembly. The at least one electronic switch is disposed under the at least one button module. A bottom surface of the at least one button module is equipped with an upper magnet disposed over a top of the lower magnet. Magnetic poles of the top of the lower magnet and a bottom of the upper magnet which are corresponding to each other are the same. When the at least one button module is pressed downward, the lower magnet drives the switch assembly to convert the switch-off state into the switch-on state by virtue of a repelling force of the upper magnet pushing against the lower magnet, so that the at least one electronic switch is triggered.

Another object of the present invention is to provide a mouse device. The mouse device includes a shell, a circuit board fastened in the shell, a first terminal, a second terminal, an elastic piece disposed between the first touch portion and the second touch portion, a lower magnet fastened to the elastic piece, an outer cover, at least one button module disposed to the shell, and an upper magnet fastened to a lower surface of the at least one button module and disposed over a top of the lower magnet. The first terminal includes a first fastening portion electrically connected with the circuit board, and a first touch portion protruded from a top end of the first fastening portion. The second terminal has an insertion foot electrically connected with the circuit board, a second touch portion positioned corresponding to the first touch portion, and a second fastening portion connected between the insertion foot and the second touch portion. The first terminal, the second terminal, the elastic piece and the lower magnet are sealed by the outer cover. Magnetic poles of the top of the lower magnet and a bottom of the upper magnet which are corresponding to each other are the same, when the at least one button module is pressed downward, the lower magnet drives the elastic piece to abut against the second touch portion by virtue of a repelling force of the upper magnet pushing against the lower magnet, when the at least one button module is released, the elastic piece returns to abut against the first touch portion by virtue of a resilient force of the elastic piece.

Another object of the present invention is to provide a mouse device. The mouse device includes a shell, a circuit board fastened in the shell, at least one electronic switch electrically connected with the circuit board, a lower magnet sealed inside the at least one electronic switch and approaching to the lacking groove, at least one button module disposed to the shell, an upper magnet fastened to a bottom surface of the pressing portion and positioned corresponding to the top of the lower magnet. The at least one electronic switch has an outer cover. The outer cover has a top board. A top surface of the top board opens a lacking groove. The bottom surface of the at least one button module protrudes downward to form a pressing portion. Magnetic poles of the top of the lower magnet and a bottom of the upper magnet which are corresponding to each other are the same, when the at least one button module is pressed downward, the upper magnet and the pressing portion of the at least one button module are capable of projecting into the lacking groove, the lower magnet drives the at least one electronic switch to convert a switch-off state into a switch-on state by virtue of a repelling force of the upper magnet pushing against the lower magnet.

As described above, the lower magnet of the mouse device is fastened to the switch assembly, and the bottom surface of the at least one button module of the mouse device is equipped with the upper magnet disposed over the lower magnet, the magnetic poles of the top of the lower magnet and the bottom of the upper magnet which are corresponding to each other are the same, when the at least one button module is pressed downward, the lower magnet of the at least one electronic switch drives the switch assembly of the at least one electronic switch to convert the switch-off state into the switch-on state by virtue of the repelling force of the upper magnet of the at least one button module pushing against the lower magnet of the at least one electronic switch, so that the at least one electronic switch is triggered, the at least one button module has no need of contacting the at least one electronic switch, so the at least one button module will be without being abraded to occur a partial abrasion phenomenon after the mouse device is used for a long time. Furthermore, an outside of the at least one electronic switch has an outer cover to have a sealing structure, after the mouse device is used for a long time, external dust particles will be without getting stuck in the at least one electronic switch, so a normal action of the at least one electronic switch is ensured. As a result, the mouse device will be still used in order and capable of keeping a better hand feeling after the mouse device is used for a long time in use.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
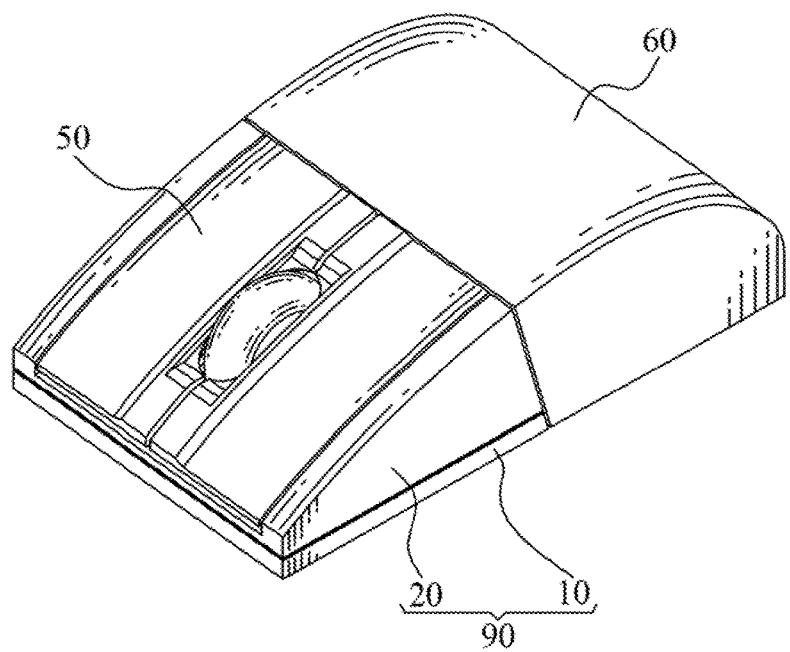
FIG. 1 is a perspective view of a mouse device in accordance with the present invention.
Figure 2:
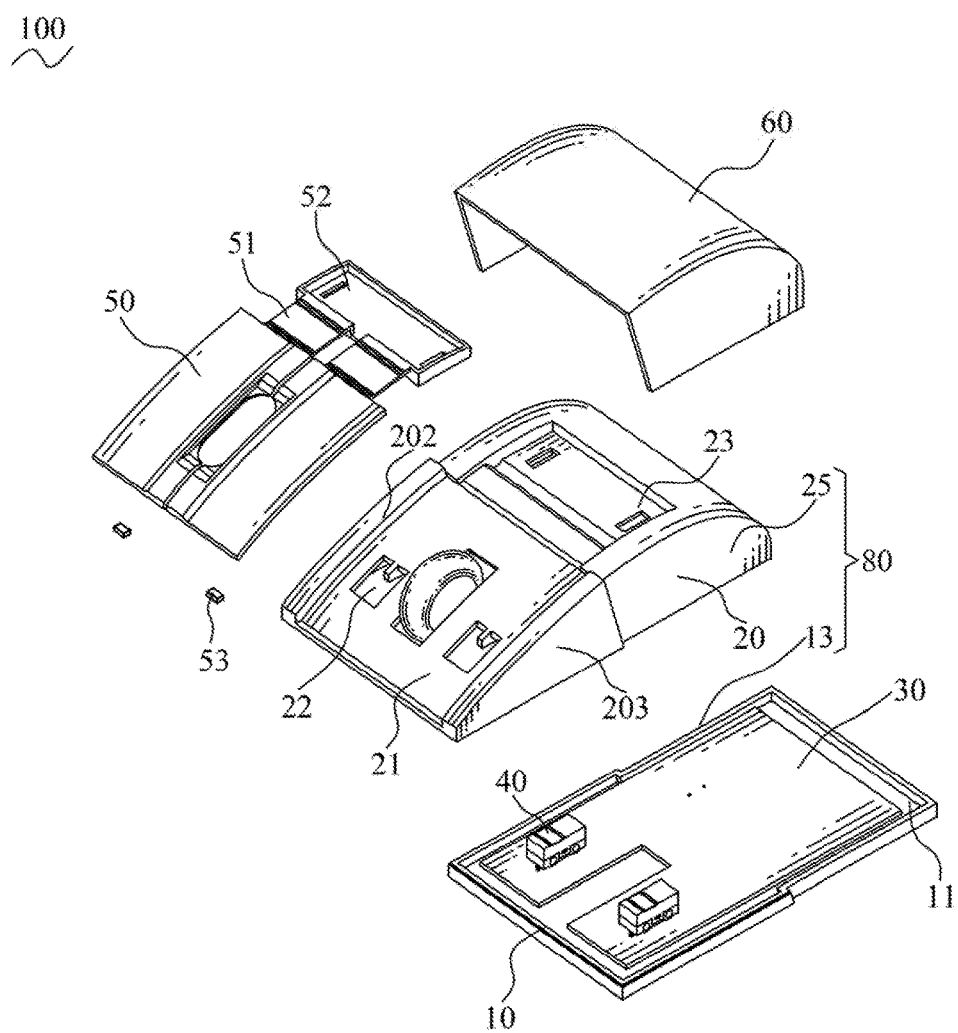
FIG. 2 is an exploded perspective view of the mouse device of FIG. 1.
Figure 5:
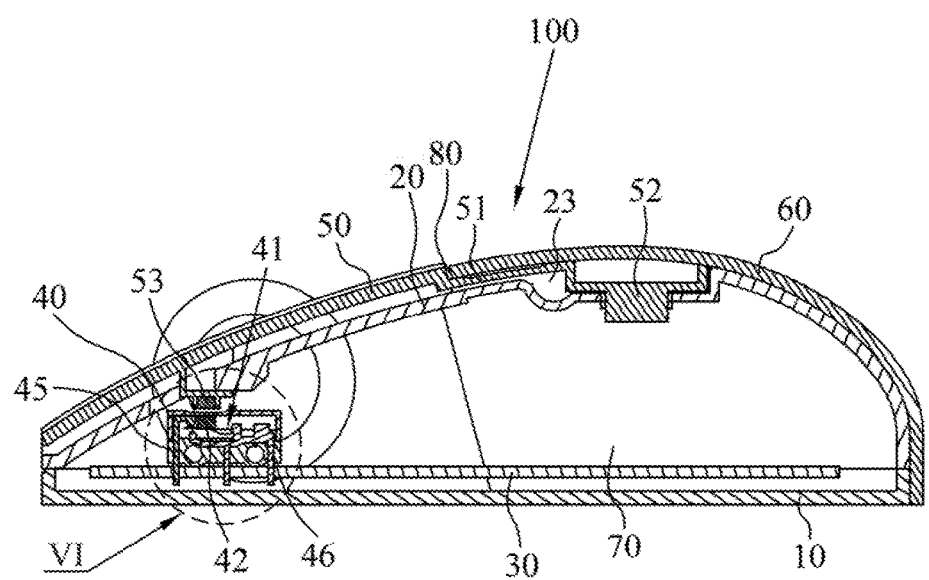
FIG. 5 is a sectional view of the mouse device of FIG. 1.

With reference to FIG. 1, FIG. 2 and FIG. 5, a mouse device 100 in accordance with the present invention is shown. The mouse device 100 includes a lower shell 10, an upper shell 20, a circuit board 30, at least one electronic switch 40, at least one button module 50 and a rear cover 60. The lower shell 10 and the upper shell 20 are assembled into a shell 90.

Referring to FIG. 1 to FIG. 5, the upper shell 20 is mounted to the lower shell 10, and a receiving space 70 is formed between the upper shell 20 and the lower shell 10. The circuit board 30 is fastened in the receiving space 70 of the shell 90. A front of a top surface of the circuit board 30 is equipped with the at least one electronic switch 40. The at least one electronic switch 40 is electrically connected with the circuit board 30. Specifically, the front of the top surface of the circuit board 30 is equipped with two electronic switches 40 arranged transversely.

Figure 3:
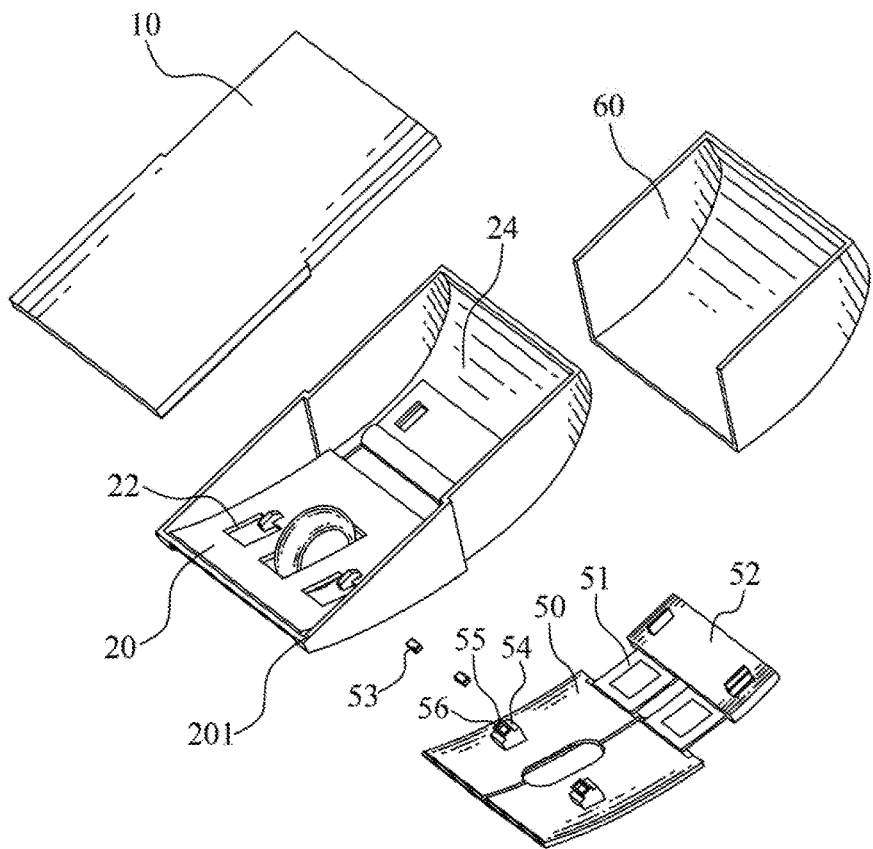
FIG. 3 is another exploded perspective view of the mouse device of FIG. 1.
Figure 4:
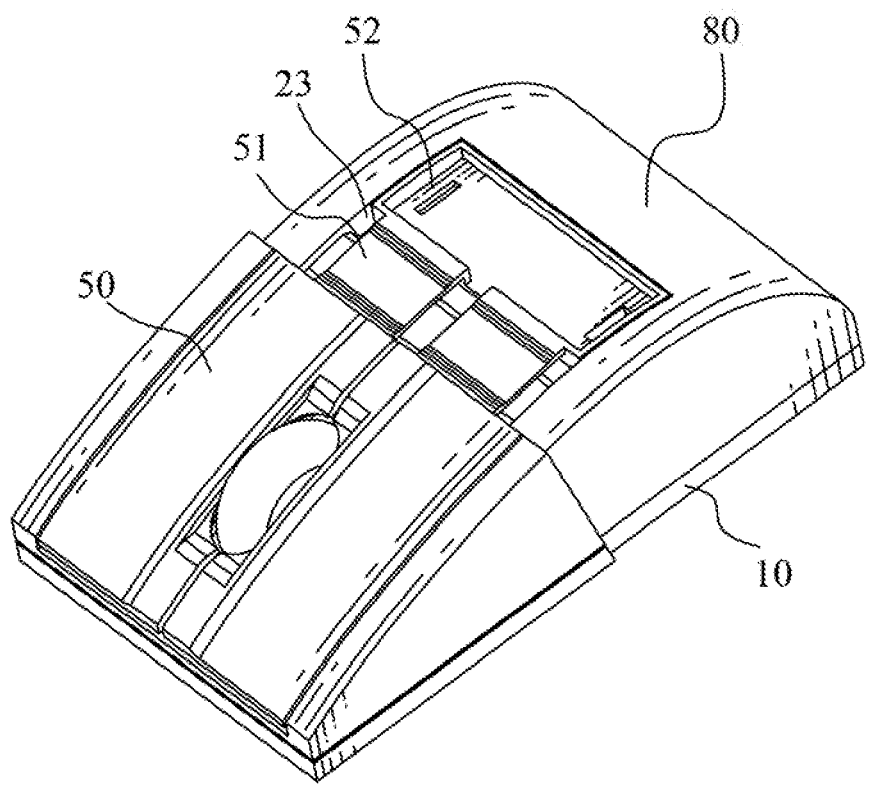
FIG. 4 is a partially perspective view of the mouse device of FIG. 1, wherein a rear cover is omitted.

Referring to FIG. 2 to FIG. 5 again, the upper shell 20 is of a hollow shape. An inside of the upper shell 20 defines a first receiving space 24 penetrating through a bottom surface 201 of the upper shell 20. A substantial middle of a top wall of the first receiving space 24 is arched upward away from the bottom surface 201 of the upper shell 20 to show a substantially arc shape. Correspondingly, the upper shell 20 has a top surface 202 of which a substantial middle is arched upward away from the bottom surface 201 of the upper shell 20. A front of the top surface 202 of the upper shell 20 is recessed inward towards the inside of the upper shell 20 to form a locating groove 21. A bottom wall of the locating groove 21 opens at least one pressing hole 22 communicated with the receiving space 70. The at least one pressing hole 22 is corresponding to the at least one electronic switch 40. A middle of the top surface 202 of the upper shell 20 is recessed inward towards the inside of the upper shell 20 to form a fastening groove 23. The fastening groove 23 is communicated with and located behind the locating groove 21.

Specifically, a portion of the top surface 202 of the upper shell 20 around the fastening groove 23 and rears of two side surfaces 203 of the upper shell 20 are recessed inward towards the inside of the upper shell 20 to form a first assembling groove 25 located behind the locating groove 21. The bottom wall of the locating groove 21 opens two pressing holes 22 communicated with the receiving space 70 and arranged transversely. The two pressing holes 22 are corresponding to the two electronic switches 40, respectively.

The lower shell 10 is mounted under the upper shell 20. The lower shell 10 opens a second receiving space 11 penetrating through a middle of a top surface of the lower shell 10. The second receiving space 11 is corresponding to and communicated with the first receiving space 24. The second receiving space 11 cooperates with the first receiving space 24 to form the receiving space 70. A rear of a peripheral surface of the lower shell 10 is recessed inward towards the second receiving space 11 to form a second assembling groove 13. The second assembling groove 13 is matched with the first assembling groove 25 to form an assembling groove 80.

Referring to FIG. 2, FIG. 5, FIG. 6 and FIG. 8, the at least one electronic switch 40 includes a switch assembly 41, a lower magnet 42 and an outer cover 43. The switch assembly 41 includes a main portion 44, an inverted L-shaped first terminal 45 fastened in the main portion 44, a second terminal 46 and an elastic piece 47. The switch assembly 41 has a switch-off state and a switch-on state. The main portion 44 is of a rectangular shape. Two opposite side surfaces of the main portion 44 protrude towards two opposite directions to form two buckling blocks 441. The main portion 44 is mounted to the front of the top surface of the circuit board 30. Each of the two electronic switches 40 has the switch assembly 41, the lower magnet 42 and the outer cover 43. The two main portions 44 of the two electronic switches 40 are mounted to the front of the top surface of the circuit board 30 and arranged transversely. The first terminal 45 has a first fastening portion 451 extending vertically, and a first touch portion 452 protruded rearward and then protruded downward from a top end of the first fastening portion 451. The first fastening portion 451 of the first terminal 45 is fastened in the main portion 44. A bottom end of the first fastening portion 451 projects beyond a bottom surface of the main portion 44 and is electrically connected with the circuit board 30. The top end of the first fastening portion 451 projects beyond one side of a top surface of the main portion 44, so that the first touch portion 452 projects beyond the one side of the top surface of the main portion 44.

The second terminal 46 is fastened in the main portion 44. The second terminal 46 has a second touch portion 463 projects beyond the one side of the top surface of the main portion 44. The second touch portion 463 is positioned corresponding to and located under the first touch portion 452. Specifically, the second terminal 46 has a second fastening portion 461 extending longitudinally. The second fastening portion 461 is fastened in the main portion 44. A bottom surface of the second fastening portion 461 protrudes downward to form an insertion foot 462. Two portions of the bottom surface of the second fastening portion 461 protrude downward to form two insertion feet 462 spaced from each other and arranged longitudinally. A bottom end of the insertion foot 462 of the second terminal 46 projects beyond the bottom surface of the main portion 44 and is electrically connected with the circuit board 30. Bottom ends of the two insertion feet 462 of the second terminal 46 project beyond the bottom surface of the main portion 44 and are electrically connected with the circuit board 30. The second touch portion 463 is protruded upward from a front of a top surface of the second fastening portion 461. The second fastening portion 461 is connected between the insertion foot 462 and the second touch portion 463. And a rear of the top surface of the second fastening portion 461 protrudes upward to form a first locating portion 464 projecting beyond the other side of the top surface of the main portion 44. A rear surface of the first locating portion 464 is shown as a stair shape. The rear surface of the first locating portion 464 includes a first stair surface 465, a second stair surface 466, and a connecting surface 467 connected between the first stair surface 465 and the second stair surface 466. A rear surface of a lower portion of the first locating portion 464 is defined as the first stair surface 465 extending vertically, and a rear surface of an upper portion of the first locating portion 464 is defined as the second stair surface 466 extending vertically. The second stair surface 466 is located in front of the first stair surface 465. The connecting surface 467 is inclined rearward and downward gradually.

Figure 8:
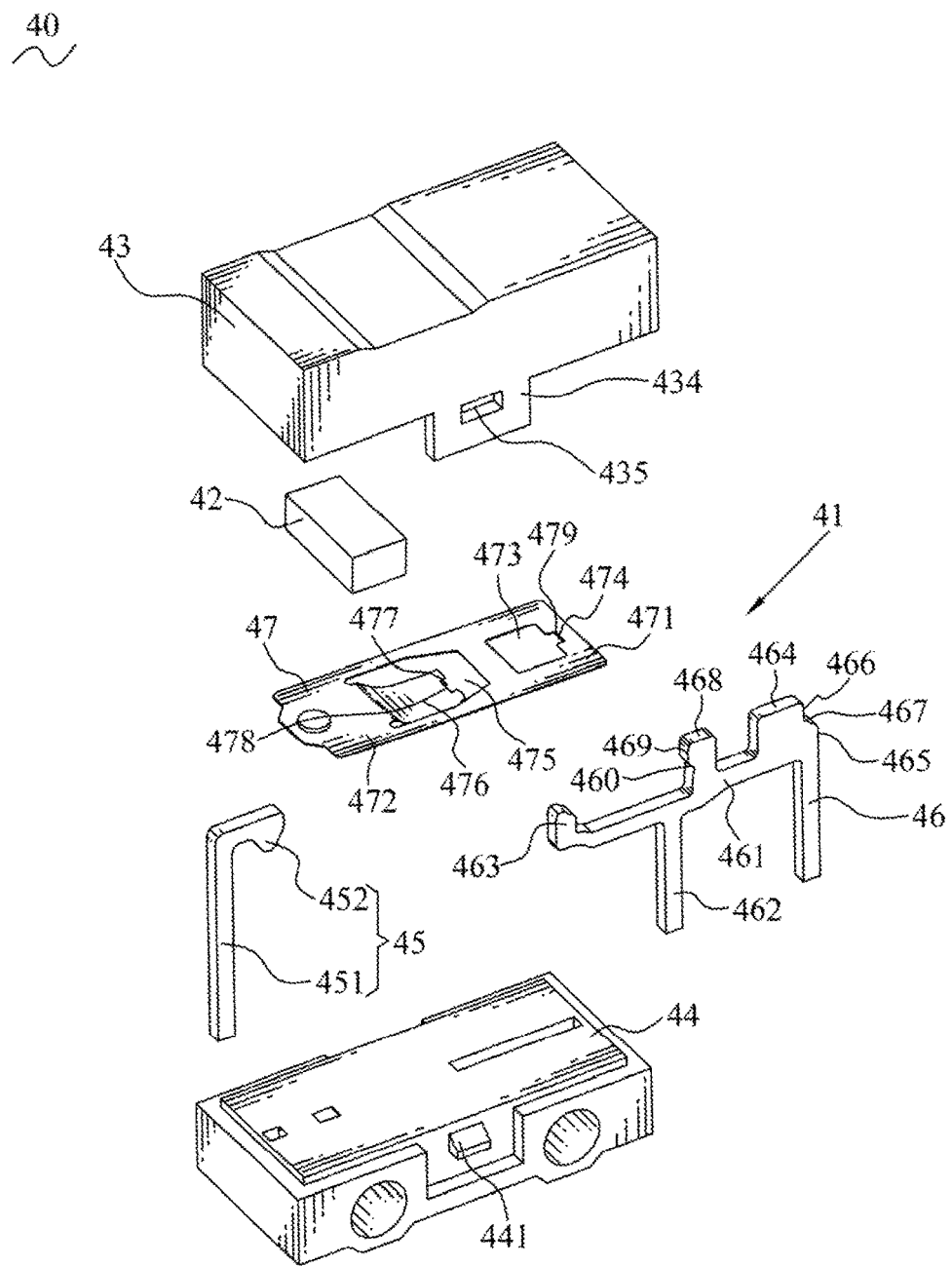
FIG. 8 is another exploded diagrammatic drawing of the electronic switch of the mouse device of FIG. 7.
Figure 9:
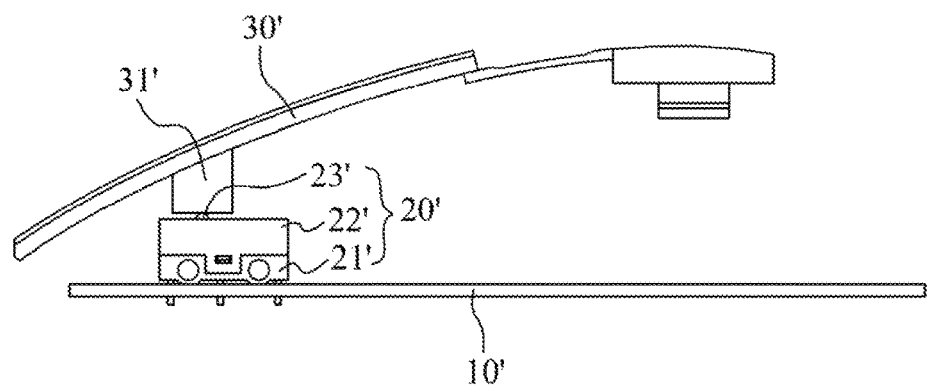
FIG. 9 is a diagrammatic drawing of a conventional mouse device in prior art.
Figure 10:
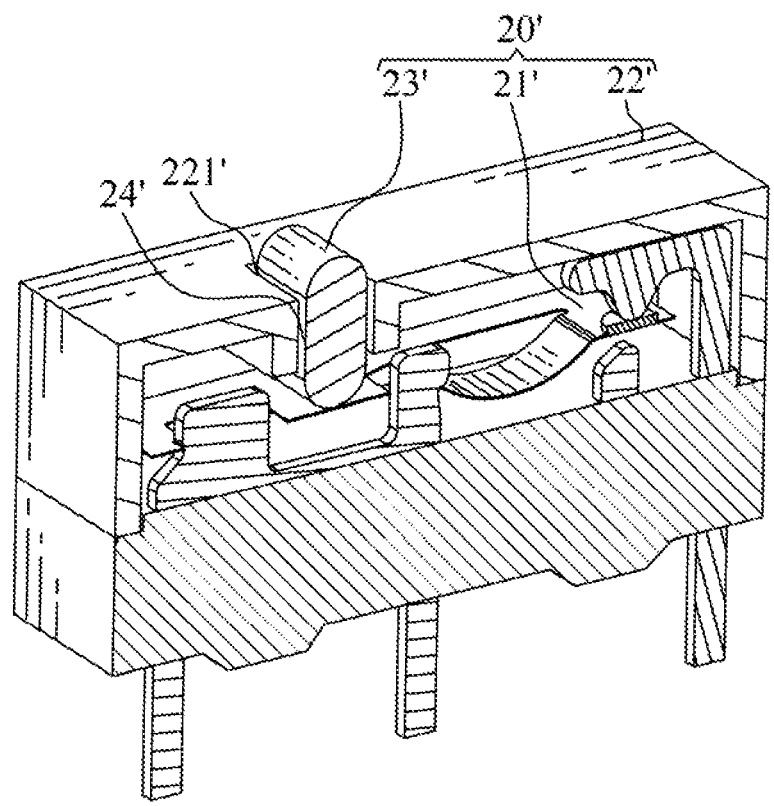
FIG. 10 is a sectional diagrammatic drawing of an electronic switch of the conventional mouse device of FIG. 9.
Figure 11:
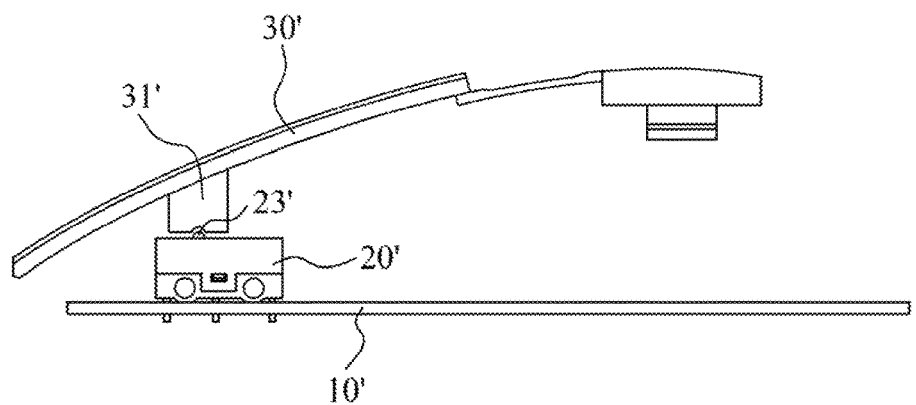
FIG. 11 is a diagrammatic drawing of the conventional mouse device of FIG. 9, wherein pressing portions are abraded after the conventional mouse device is used for a long time.

FIG. 5 and FIG. 8, a middle of the top surface of the second fastening portion 461 protrudes upward to form a second locating portion 468 projecting beyond the top surface of the main portion 44. A top of a front surface of the second locating portion 468 protrudes frontward to form a blocking portion 469. A bottom surface of the blocking portion 469 is an inclined surface slantwise extending rearward and downward gradually.

Figure 6:
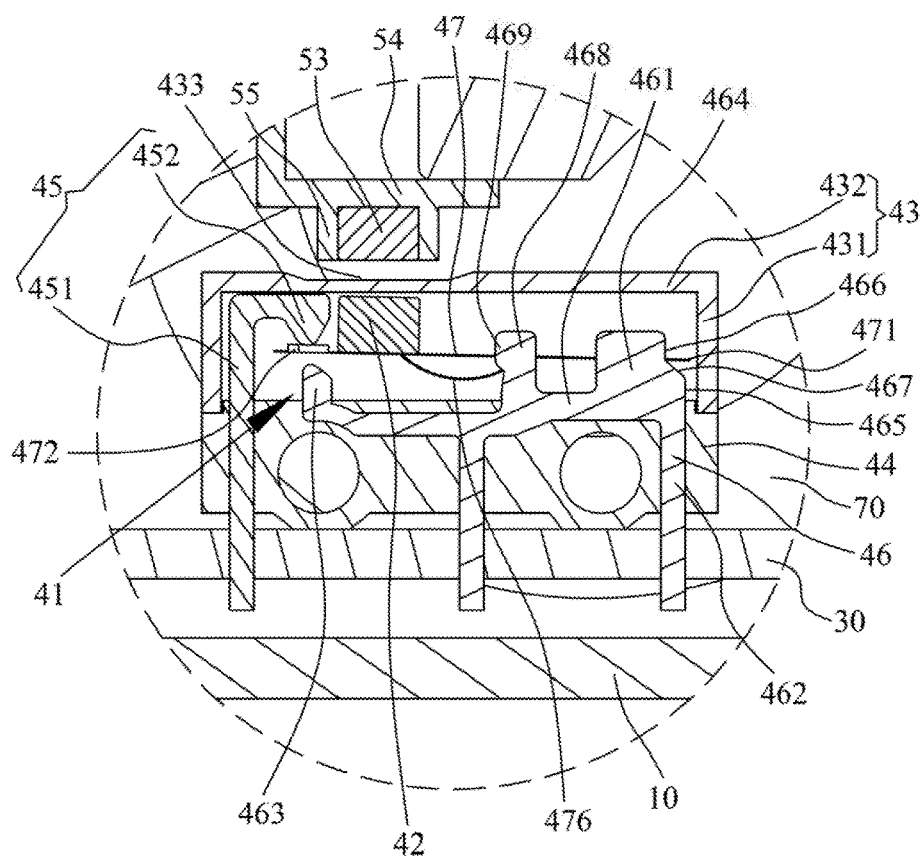
FIG. 6 is an enlarged view of an encircled portion VI of the mouse device of FIG. 5.
Figure 7:
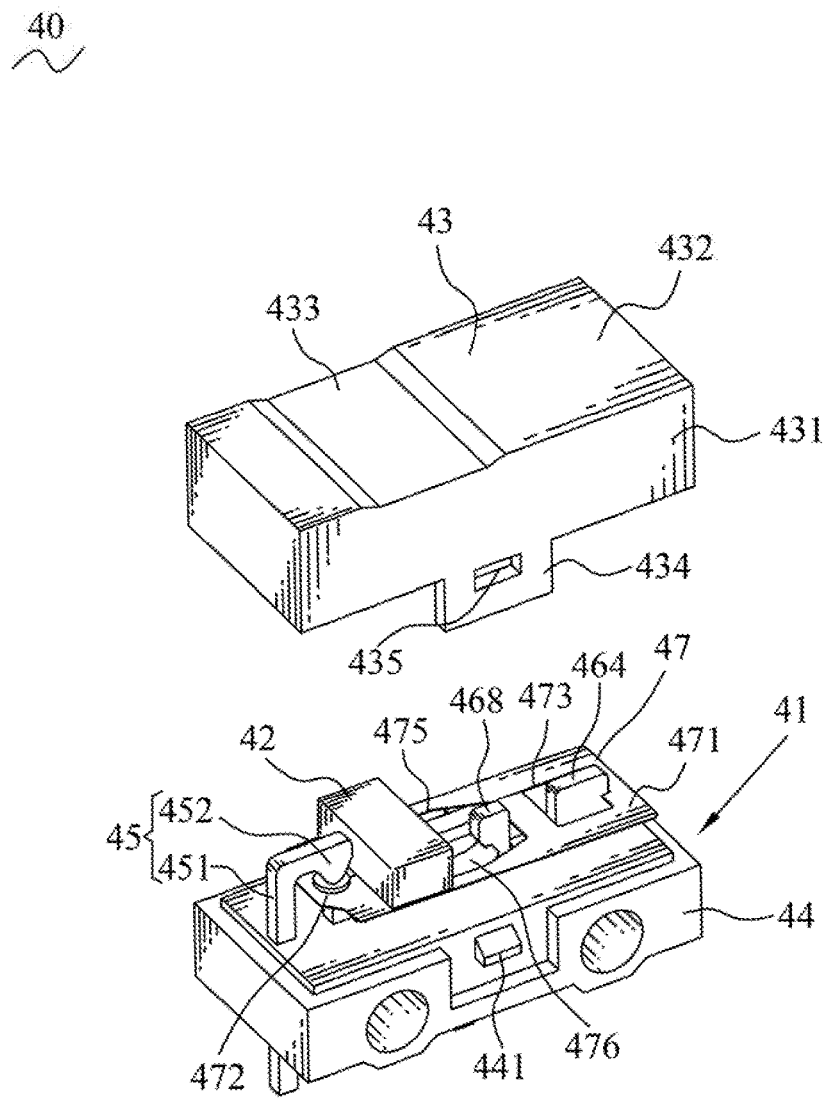
FIG. 7 is an exploded diagrammatic drawing of an electronic switch of the mouse device of FIG. 1.

Referring to FIG. 6 to FIG. 8, two opposite ends of the elastic piece 47 have a fastening end 471 and a free end 472, respectively. The fastening end 471 is fastened to the first locating portion 464. The free end 472 of the elastic piece 47 is disposed between the first touch portion 452 and the second touch portion 463. When the switch assembly 41 is in the switch-off state, the free end 472 elastically abuts against the first touch portion 452. When the switch assembly 41 is in the switch-on state, the free end 472 elastically abuts against the second touch portion 463. Specifically, the elastic piece 47 is of a plate shape. The fastening end 471 of the elastic piece 47 opens a first receiving hole 473 corresponding to the first locating portion 464. A rear wall of the first receiving hole 473 opens a first notch 474. The upper portion of the first locating portion 464 is received in the first receiving hole 473. A rear end of the upper portion of the first locating portion 464 is received in the first notch 474. The connecting surface 467 is located under and faces to a bottom surface of the elastic piece 47. The bottom surface of the elastic piece 47 is blocked by the connecting surface 467.

A middle of the elastic piece 47 opens a second receiving hole 475 corresponding to the second locating portion 468. A front wall of the second receiving hole 475 is connected with an arc-shaped elastic arm 476 received in the second receiving hole 475. A middle of the elastic arm 476 is arched downward. A top of the second locating portion 468 is received in the second receiving hole 475. A rear end of the elastic arm 476 abuts against the bottom surface of the blocking portion 469. Specifically, a middle of the rear end of the elastic arm 476 opens a second notch 477. The bottom surface of the blocking portion 469 is blocked in the second notch 477. A front wall 478 of the second notch 477 abuts against the bottom surface 460 of the blocking portion 469.

Referring to FIG. 6 and FIG. 7, the lower magnet 42 is mounted to the switch assembly 41. The lower magnet 42 is fastened to the free end 472 of the elastic piece 47 of the switch assembly 41. Specifically, the lower magnet 42 is adhered to the free end 472 of the elastic piece 47 of the switch assembly 41. The outer cover 43 covers outsides of the main portion 44, the first touch portion 452, the second touch portion 463, the elastic piece 47 and the lower magnet 42, so the at least one electronic switch 40 is sealed by the outer cover 43, and the main portion 44, the first touch portion 452, the second touch portion 463, the elastic piece 47 and the lower magnet 42 are isolated from an external environment of the outer cover 43 by the outer cover 43. Correspondingly, the first terminal 45, the second terminal 46, the elastic piece 47 and the lower magnet 42 are sealed by the outer cover 43. The outer cover 43 has a top board 432, and a plurality of side boards 431 protruded downward from a periphery of the top board 432. The outer cover 43 is surrounded by the top board 432 and the plurality of the side boards 431. The plurality of the side boards 431 are fastened to the main portion 44. Preferably, four side boards 431 are protruded downward from the periphery of the top board 432. The outer cover 43 is surrounded by the top board 432 and the four side boards 431. The four side boards 431 are fastened to the main portion 44. The lower magnet 42 is located under the top board 432. A top surface of the top board 432 opens a lacking groove 433 corresponding to the lower magnet 42. The lower magnet 42 is sealed inside the at least one electronic switch 40 and approaches to the lacking groove 433. Bottoms of two of the side boards 431 protrude downward to form two buckling portions 434. The two buckling portions 434 open two buckling holes 435, respectively. The two buckling blocks 441 are buckled in the two buckling holes 435, respectively.

FIG. 1 to FIG. 6, the at least one button module 50 is disposed to the front of the top surface 202 of the upper shell 20 of the shell 90. A rear end of the at least one button module 50 is fastened to a middle of the upper shell 20. A bottom surface of the at least one button module 50 is equipped with an upper magnet 53 disposed over a top of the lower magnet 42. The upper magnet 53 is fastened to a lower surface of the at least one button module 50. A rear end of the at least one button module 50 is connected with a cantilever arm 51. The at least one electronic switch 40 is disposed under the at least one button module 50. The bottom surface of the at least one button module 50 protrudes downward to form a pressing portion 54 corresponding to the top of the lower magnet 42. The upper magnet 53 is fastened to a bottom surface of the pressing portion 54 and positioned corresponding to the top of the lower magnet 42. The pressing portion 54 of the at least one button module 50 is received in the at least one pressing hole 22. A bottom surface of the pressing portion 54 protrudes downward to form a fixing portion 55. The fixing portion 55 opens a fixing hole 56. The upper magnet 53 is fastened in the fixing hole 56. A bottom surface of the upper magnet 53 is flush with a bottom surface of the fixing portion 55. Preferably, the mouse device 100 includes two button modules 50 disposed in the locating groove 21 and arranged transversely. The two electronic switches 40 are disposed under the two button modules 50. Rear ends of the two button modules 50 are connected with two cantilever arms 51 extending rearward. The two cantilever arms 51 are received in a front of the fastening groove 23. Tail ends of the two cantilever arms 51 are connected with a fastening board 52. The fastening board 52 is fastened in a rear of the fastening groove 23. Bottom surfaces of the two button modules 50 are equipped with two upper magnets 53 corresponding to tops of the two lower magnets 42 of the two electronic switches 40. Magnetic poles of the top of the lower magnet 42 and a bottom of the upper magnet 53 which are corresponding to each other are the same. Magnetic poles of two corresponding surfaces of the lower magnet 42 and the upper magnet 53 respectively located above and under the top board 432 of the outer cover 43 are the same. Specifically, the bottom surfaces of the two button modules 50 protrude downward to form two pressing portions 54 corresponding to the tops of the two lower magnets 42. The two pressing portions 54 of the two button modules 50 are received in the two pressing holes 22, respectively. Bottom surfaces of the two pressing portions 54 protrude downward to form two fixing portions 55. The two fixing portions 55 open two fixing holes 56, respectively. The two upper magnets 53 are fastened in the two fixing holes 56. Bottom surfaces of the two upper magnets 53 are flush with bottom surfaces of the two fixing portions 55.

Referring to FIG. 5, the rear cover 60 covers rears of the lower shell 10 and the upper shell 20, and covers the two cantilever arms 51 and the fastening board 52 in the rear cover 60. The rear cover 60 is assembled in the assembling groove 80.

Referring to FIG. 5 to FIG. 8, in use, when the at least one button module 50 is pressed downward by a user (not shown), the lower magnet 42 of the at least one electronic switch 40 drives the switch assembly 41 of the at least one electronic switch 40 to convert the switch-off state into the switch-on state by virtue of a repelling force of the upper magnet 53 of the at least one button module 50 pushing against the lower magnet 42 of the at least one electronic switch 40, so that the at least one electronic switch 40 is triggered. The fixing portion 55 of the pressing portion 54 and the upper magnet 53 of the at least one button module 50 are capable of projecting into the lacking groove 433 to make the upper magnet 53 of the at least one button module 50 closer to the lower magnet 42 of the at least one electronic switch 40. After the at least one button module 50 is completed being pressed downward by the user, the at least one button module 50 is released, the cantilever arm 51 of the at least one button module 50 drives the at least one button module 50 to be restored. The free end 472 of the elastic piece 47 returns to abut against the first touch portion 452 by virtue of a resilient force of the elastic arm 476, and the switch assembly 41 of the at least one electronic switch 40 is restored to the switch-off state.

Specifically, the two button modules 50 are pressed downward by the user. The repelling forces of the two upper magnets 53 of the two button modules 50 push against the two lower magnets 42 of the two electronic switches 40 to drive the free ends 472 of the elastic pieces 47 of the two electronic switches 40 to move downward until the free ends 472 of the elastic pieces 47 of the two electronic switches 40 abut against the second touch portions 463 of the second terminals 46 of the two electronic switches 40. A rear wall 479 of the first notch 474 abuts against the second stair surface 466. A rear wall of the second receiving hole 475 abuts against a rear surface of the second locating portion 468, so that the fastening end 471 of the elastic piece 47 is kept in a constant position. After the two button modules 50 are completed being pressed downward by the user, the two button modules 50 are released, the two cantilever arms 51 of the two button modules 50 drive the two button modules 50 to be restored. The free ends 472 of the elastic pieces 47 of the two switch assemblies 41 of the two electronic switches 40 return to abut against the first touch portions 452 of the two electronic switches 40 by virtue of the resilient forces of the elastic arms 476 of the two electronic switches 40, and the switch assemblies 41 of the two electronic switches 40 are restored to the switch-off states.

As described above, the lower magnet 42 of the mouse device 100 is fastened to the switch assembly 41, and the bottom surface of the at least one button module 50 of the mouse device 100 is equipped with the upper magnet 53 disposed over the lower magnet 42, the magnetic poles of the top of the lower magnet 42 and the bottom of the upper magnet 53 which are corresponding to each other are the same, when the at least one button module 50 is pressed downward, the lower magnet 42 of the at least one electronic switch 40 drives the switch assembly 41 of the at least one electronic switch 40 to convert the switch-off state into the switch-on state by virtue of the repelling force of the upper magnet 53 of the at least one button module 50 pushing against the lower magnet 42 of the at least one electronic switch 40, so that the at least one electronic switch 40 is triggered, the at least one button module 50 has no need of contacting the at least one electronic switch 40, so the at least one button module 50 will be without being abraded to occur a partial abrasion phenomenon after the mouse device 100 is used for a long time. Furthermore, the at least one electronic switch 40 is sealed by the outer cover 43, after the mouse device 100 is used for a long time, external dust particles will be without getting stuck in the at least one electronic switch 40, so a normal action of the at least one electronic switch 40 is ensured. As a result, the mouse device 100 will be still used in order and capable of keeping a better hand feeling after the mouse device 100 is used for a long time in use.

What is claimed is:
1. A mouse device, comprising:
at least one electronic switch, including:
a switch assembly having a switch-off state and a switch-on state; and a lower magnet mounted to the switch assembly; and
at least one button module, the at least one electronic switch being disposed under the at least one button module, a bottom surface of the at least one button module being equipped with an upper magnet disposed over a top of the lower magnet, magnetic poles of the top of the lower magnet and a bottom of the upper magnet which are corresponding to each other being the same, when the at least one button module is pressed downward, the lower magnet driving the switch assembly to convert the switch-off state into the switch-on state by virtue of a repelling force of the upper magnet pushing against the lower magnet, so that the at least one electronic switch is triggered;
wherein the switch assembly includes a main portion, a first terminal fastened in the main portion, a second terminal fastened in the main portion, and an elastic piece, the first terminal has a first touch portion projecting beyond one side of a top surface of the main portion, the second terminal has a second touch portion projecting beyond the one side of the top surface of the main portion, and a first locating portion projecting beyond the other side of the top surface of the main portion, the second touch portion is located under the first touch portion, two opposite ends of the elastic piece have a fastening end fastened to the first locating portion, and a free end disposed between the first touch portion and the second touch portion, when the switch assembly is in a switch-off state, the free end elastically abuts against the first touch portion, when the switch assembly is in a switch-on state, the free end elastically abuts against the second touch portion.

2. The mouse device as claimed in claim 1, wherein the lower magnet is fastened to the free end of the elastic piece.

3. The mouse device as claimed in claim 1, wherein the at least one electronic switch further includes an outer cover, the outer cover covers outsides of the main portion, the first touch portion, the second touch portion, the elastic piece and the lower magnet.

4. The mouse device as claimed in claim 3, wherein the outer cover has a top board, and a plurality of side boards protruded downward from a periphery of the top board, the plurality of the side boards are fastened to the main portion, the lower magnet is located under the top board.

5. The mouse device as claimed in claim 4, wherein two opposite side surfaces of the main portion protrude towards two opposite directions to form two buckling blocks, bottoms of two of the side boards protrude downward to form two buckling portions, the two buckling portions open two buckling holes, respectively, the two buckling blocks are buckled in the two buckling holes, respectively.

6. The mouse device as claimed in claim 1, wherein the bottom surface of the at least one button module protrudes downward to form a pressing portion corresponding to the top of the lower magnet, a bottom surface of the pressing portion protrudes downward to form a fixing portion, the fixing portion opens a fixing hole, the upper magnet is fastened in the fixing hole.

7. The mouse device as claimed in claim 6, wherein a bottom surface of the upper magnet is flush with a bottom surface of the fixing portion.

8. The mouse device as claimed in claim 6, wherein the at least one electronic switch further includes an outer cover which has a top board, a top surface of the top board opens a lacking groove corresponding to the lower magnet, when the at least one button module is pressed downward, the fixing portion and the upper magnet of the at least one button module are capable of projecting into the lacking groove.

9. The mouse device as claimed in claim 1, wherein the first terminal has a first fastening portion extending vertically, and the first touch portion protruded rearward and then protruded downward from a top end of the first fastening portion, the first fastening portion is fastened in the main portion, a bottom end of the first fastening portion projects beyond a bottom surface of the main portion, the top end of the first fastening portion projects beyond the one side of the top surface of the main portion.

10. The mouse device as claimed in claim 1, wherein the second terminal has a second fastening portion extending longitudinally, two portions of a bottom surface of the second fastening portion protrude downward to form two insertion feet, the second fastening portion is fastened in the main portion, bottom ends of the two insertion feet project beyond a bottom surface of the main portion, the second touch portion is protruded upward from a front of a top surface of the second fastening portion, a rear of the top surface of the second fastening portion protrudes upward to form the first locating portion.

11. The mouse device as claimed in claim 10, wherein a middle of the top surface of the second fastening portion protrudes upward to form a second locating portion projecting beyond the top surface of the main portion, a top of a front surface of the second locating portion protrudes frontward to form a blocking portion, a middle of the elastic piece opens a second receiving hole corresponding to the second locating portion, a front wall of the second receiving hole is connected with an elastic arm received in the second receiving hole, a top of the second locating portion is received in the second receiving hole, a middle of a rear end of the elastic arm opens a second notch, a bottom surface of the blocking portion is blocked in the second notch.

12. The mouse device as claimed in claim 1, wherein the fastening end of the elastic piece opens a first receiving hole corresponding to the first locating portion, a rear wall of the first receiving hole opens a first notch, an upper portion of the first locating portion is received in the first receiving hole, a rear end of the upper portion of the first locating portion is received in the first notch.

13. A mouse device, comprising:
a shell;
a circuit board fastened in the shell;
a first terminal including a first fastening portion electrically connected with the circuit board, and a first touch portion protruded from a top end of the first fastening portion;
a second terminal having an insertion foot electrically connected with the circuit board, a second touch portion positioned corresponding to the first touch portion, and a second fastening portion connected between the insertion foot and the second touch portion;
an elastic piece disposed between the first touch portion and the second touch portion;
a lower magnet fastened to the elastic piece;
an outer cover, the first terminal, the second terminal, the elastic piece and the lower magnet being sealed by the outer cover;
at least one button module disposed to the shell; and
an upper magnet fastened to a lower surface of the at least one button module and disposed over a top of the lower magnet;
wherein magnetic poles of the top of the lower magnet and a bottom of the upper magnet which are corresponding to each other are the same, when the at least one button module is pressed downward, the lower magnet drives the elastic piece to abut against the second touch portion by virtue of a repelling force of the upper magnet pushing against the lower magnet, when the at least one button module is released, the elastic piece returns to abut against the first touch portion by virtue of a resilient force of the elastic piece.

14. The mouse device as claimed in claim 13, wherein the second touch portion is protruded upward from a front of a top surface of the second fastening portion, a rear of the top surface of the second fastening portion protrudes upward to form a first locating portion, the first touch portion is protruded rearward and then protruded downward from a top end of the first fastening portion, two opposite ends of the elastic piece have a fastening end fastened to the first locating portion and a free end disposed between the first touch portion and the second touch portion, the lower magnet is fastened to the free end of the elastic piece.

15. The mouse device as claimed in claim 14, wherein the fastening end of the elastic piece opens a first receiving hole corresponding to the first locating portion, a rear wall of the first receiving hole opens a first notch, an upper portion of the first locating portion is received in the first receiving hole, a rear end of the upper portion of the first locating portion is received in the first notch.

16. The mouse device as claimed in claim 15, wherein a middle of the top surface of the second fastening portion protrudes upward to form a second locating portion, a top of a front surface of the second locating portion protrudes frontward to form a blocking portion, a middle of the elastic piece opens a second receiving hole corresponding to the second locating portion, a front wall of the second receiving hole is connected with an elastic arm received in the second receiving hole, a top of the second locating portion is received in the second receiving hole, a middle of a rear end of the elastic arm opens a second notch, a bottom surface of the blocking portion is blocked in the second notch.

17. A mouse device, comprising:
a shell;
a circuit board fastened in the shell;
at least one electronic switch electrically connected with the circuit board, the at least one electronic switch having an outer cover, the outer cover having a top board, a top surface of the top board opening a lacking groove;
a lower magnet sealed inside the at least one electronic switch and approaching to the lacking groove;
at least one button module disposed to the shell, the bottom surface of the at least one button module protruding downward to form a pressing portion; and
an upper magnet fastened to a bottom surface of the pressing portion and positioned corresponding to the top of the lower magnet;
wherein magnetic poles of the top of the lower magnet and a bottom of the upper magnet which are corresponding to each other are the same, when the at least one button module is pressed downward, the upper magnet and the pressing portion of the at least one button module are capable of projecting into the lacking groove, the lower magnet drives the at least one electronic switch to convert a switch-off state into a switch-on state by virtue of a repelling force of the upper magnet pushing against the lower magnet.

18. The mouse device as claimed in claim 17, wherein the at least one electronic switch includes a switch assembly which includes a main portion, a first terminal fastened in the main portion, a second terminal fastened in the main portion, and an elastic piece, the first terminal has a first touch portion projecting beyond one side of a top surface of the main portion, the second terminal has a second touch portion projecting beyond the one side of the top surface of the main portion, and a first locating portion projecting beyond the other side of the top surface of the main portion, the second touch portion is located under the first touch portion, two opposite ends of the elastic piece have a fastening end fastened to the first locating portion and a free end disposed between the first touch portion and the second touch portion, when the switch assembly is in a switch-off state, the free end elastically abuts against the first touch portion, when the switch assembly is in a switch-on state, the free end elastically abuts against the second touch portion.

19. The mouse device as claimed in claim 18, wherein the lower magnet is fastened to the free end of the elastic piece.

* * * * *